United States Patent [19]
Chin et al.

[11] Patent Number: 5,120,674
[45] Date of Patent: Jun. 9, 1992

[54] METHOD OF MAKING STACKED CAPACITOR DRAM CELL

[75] Inventors: Dae-Je Chin, Seoul; Tae-Young Chung, Kyungki, both of Rep. of Korea

[73] Assignee: Samsung Electronics Co., Ltd., Suwon, Rep. of Korea

[21] Appl. No.: 431,790

[22] Filed: Nov. 6, 1989

Related U.S. Application Data

[62] Division of Ser. No. 283,968, Dec. 13, 1988.

[30] Foreign Application Priority Data

Jun. 7, 1988 [KR] Rep. of Korea .................... 88-6796

[51] Int. Cl.[5] .............................................. H01L 21/70
[52] U.S. Cl. ......................................... 437/52; 437/47; 437/48; 437/60; 437/919
[58] Field of Search ................... 437/47, 48, 51, 52, 437/60, 233, 228, 235, 919; 357/23.6, 51

[56] References Cited

U.S. PATENT DOCUMENTS

| | | | |
|---|---|---|---|
| 3,936,331 | 2/1976 | Luce et al. | 437/233 |
| 4,214,946 | 2/1980 | Forget et al. | 437/233 |
| 4,251,571 | 2/1981 | Garbarino et al. | 437/233 |
| 4,742,018 | 5/1988 | Kimura et al. | 437/48 |
| 4,871,688 | 10/1989 | Lowrey | 437/233 |
| 5,021,357 | 6/1991 | Taguchi et al. | 437/919 |

FOREIGN PATENT DOCUMENTS

| | | | |
|---|---|---|---|
| 0295709 | 12/1988 | European Pat. Off. | 351/236 |
| 0049553 | 5/1981 | Japan | 437/52 |

*Primary Examiner*—Tom Thomas
*Attorney, Agent, or Firm*—Ladas & Parry

[57] ABSTRACT

A saddled and wrapped stack capacitor DRAM and a method thereof are provided. The DRAM of the invention includes three foactors in increasing the effective areas for a capacitor. One is a storage poly layer comprising a first poly layer and a second poly layer, which is formed thick in a region over a field oxide layer through two steps; another is a spacer which is formed through an etchback technique for an oxide layer coated on another oxide layer being patterned to selectively remove the storage poly layer, and the spacer makes the storage poly to be remained maximize or be proper by controlling the size thereof; another is an undercut which is formed in boundary regions on an upper oxide layer, on which a plate poly material is coated and wraps.

8 Claims, 9 Drawing Sheets

METHOD OF MAKING STACKED CAPACITOR DRAM CELL

This is a divisional of copending application Ser. No. 07/283,968 filed on Dec. 13, 1988.

BACKGROUND OF THE INVENTION

This invention relates to DRAM (Dynamic Random Access Memory) cells and a method for manufacturing them, and more particularly to a stack capacitor DRAM cell which can obtain a high-capacitance without the increment of capacitor area in a semiconductor device. Recently, in the field of DRAM technology, the effort of minimizing the chip size has been competed, while the capacitance value needed for each cell has been maintained. According to such trend, the trench capacitor DRAM cell and stack capacitor DRAM cell came on. These techniques contributed largely to the high-density DRAM technology.

To explain the method for manufacturing a stack capacitor DRAM cell, referring to FIG. 1 which shows the vertical cross-sectional view of a stack capacitor DRAM cell, the fabricating processes of the stack capacitor DRAM cell are as follows.

At first, a p-well 32 is formed in a p-type substrate 31. A field oxide 34 is grown on an active region over the p-well, and a + layer is formed by injecting impurities. After above processes, a gate poly 35 and a source-drain region for transistors are formed, and a contact is formed to form a storage poly 41, and said storage poly is etched selectively.

Thereafter, an insulating layer 46 for a capacitor is formed by oxidizing said storage poly, and a plate poly 48 is deposited. The layers of an oxide 49, a polycide 50, a B-PSG 51 and a metal 52 are formed in sequence, now the series of processes for manufacturing a DRAM cell are completed.

The effective area of a capacitor 41 of a DRAM cell manufactured by the above described way is determined by the top and side area of the storage poly. To increase the effective area of the stack capacitor, the thickness of the storage poly 41 is increased up to now.

However, the magnitude of the capacitance manufactured by way of increasing the side area is not sufficient for high-density memories because the cell area of a 4M DRAM is 10 μm², but that of a 16M DRAM comes to reduce to 5 μm². The increment of thickness of the storage poly in the entire area of the cell causes the deterioration of cell topology so that the patterning of the storage poly and the bit-line and the metal is difficult. The manufacturing of the high-density DRAMS beyond 4M DRAM is difficult by the conventional technology. The reason is that the capacitance per unit cell reduces remarkably when the 16M DRAM is manufactured by the prior technology.

SUMMARY OF THE INVENTION

The object of the invention is to provide a stack capacitor DRAM cell and a method thereof which makes the manufacturing of a 16M DRAM possible by maximizing the effective area of the stack capacitor in a confined area.

The invention, in a first aspect, is a stack capacitor DRAM in which the effective area of the capacitor is maximized with a storage poly layer for capacitor. There is three factors in increasing the effective area according to the present invention.

One factor is that the storage poly layer which is formed thick in a region over the field oxide layer. That is, the region in the storage poly layer over the field oxide layer is twice coated by the poly-silicon so that the capacitance increases as much as that.

When a first poly layer is removed except the portion over the field oxide layer, it is preferable to use a saddle mask. That is because the etched surface of the storage poly layer is very rough, and this conditions make the effective area for the capacitor increase in a large scale.

The formation of the storage poly layer through two steps leads a topology to be improved as the thickness in the region of a bit line contact is shallow.

Second, a spacer controls the magnitude of a capacitance. While the etching process of the storage poly layer employing the oxide layer on the storage poly as an etching mask, the etching pattern of the oxide layer is restricted by the resolution capability of a photoresist. Therefore, since the size of the etching pattern is determined by the resolution capability, the quantity of the storage poly layer to be removed is also effected by the resolution capability. However, the spacers cause the remaining storage poly layer to be large as the portion thereof to be removed is small.

An undercut is included as one of three factors. The undercut is carried out in the region just below the boundary region of the storage poly layer. Accordingly the effective area is increased once more.

As depicted in FIG. 4, the stacked capacitor according to the invention is increased in a curved surface with the saddle mask, and the oxide layer under the storage poly layer is wrapped by a capacitor dielectric layer. Now we call this structure the saddled and wrapped stack capacitor.

The invention, in another aspect, is a method of manufacturing the saddled and wrapped stack capacitor DRAM.

DETAILED DESCRIPTION OF THE PREFERRED EMBODIMENT

The present invention will now be described in details with reference to the accompanying drawings.

Figure 1:
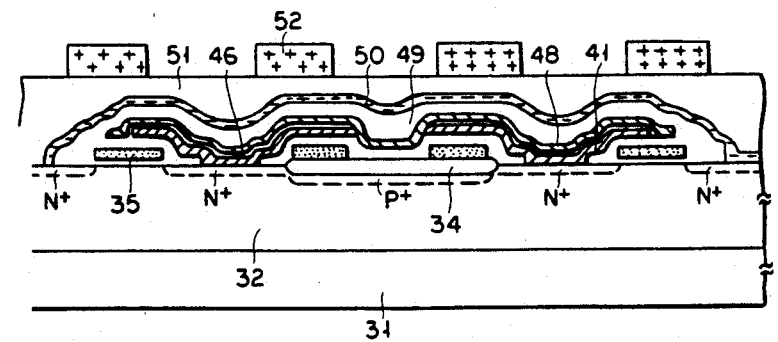
FIG. 1 is a vertical cross-sectional view of a prior DRAM cell.
Figure 2:
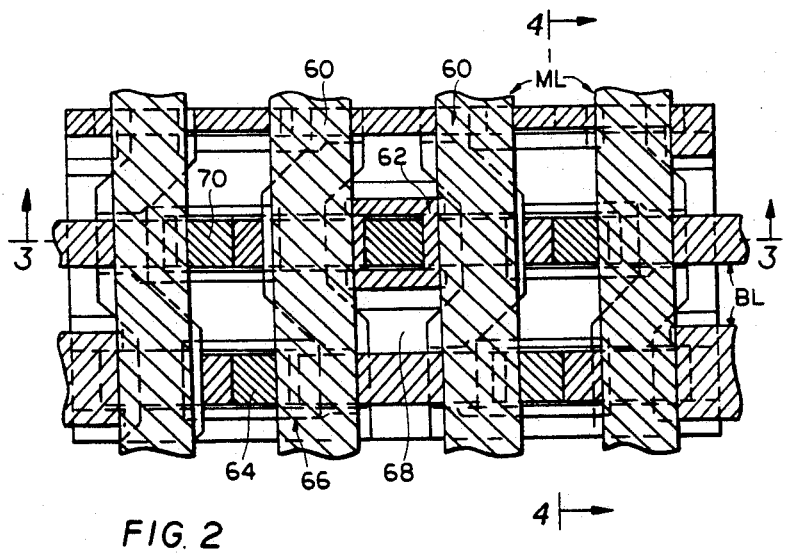
FIG. 2 is a plane layout of a stack capacitor DRAM cell of this invention.

In FIG. 2, the reference numeral 60 is a gate poly and the numeral 62 is a saddle mask. The reference numerals 64, 66 are a buried contact and a storage poly respectively. The numeral 68 is a plate poly and a bit line contact is indicated by the numeral 70. The characters ML and BL shows a metal line and a bit line, respectively.

FIG. 5 is a vertical cross-sectional view showing in sequential order the steps of an embodiment for manufacturing a stack capacitor DRAM. Referring now to FIG. 5A, a p-type will 2 and a n-type well 3 are formed on a p-type substrate 1.

Hereinafter, the preferred embodiment of this invention will now be described by setting the p-well on the basis of describing the embodiment. For the n-well, only the type of impurities is changed.

Figure 5A:
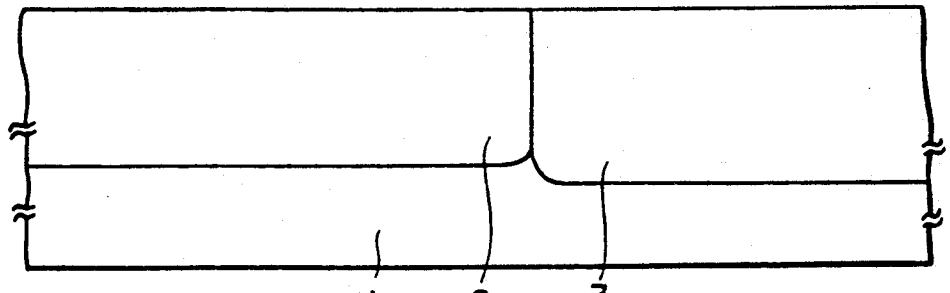
FIG. 5A to 5L are vertical cross-sectional vies of each process showing in sequential order the steps of an embodiment for manufacturing the DRAM cell of this invention.
Figure 5B:
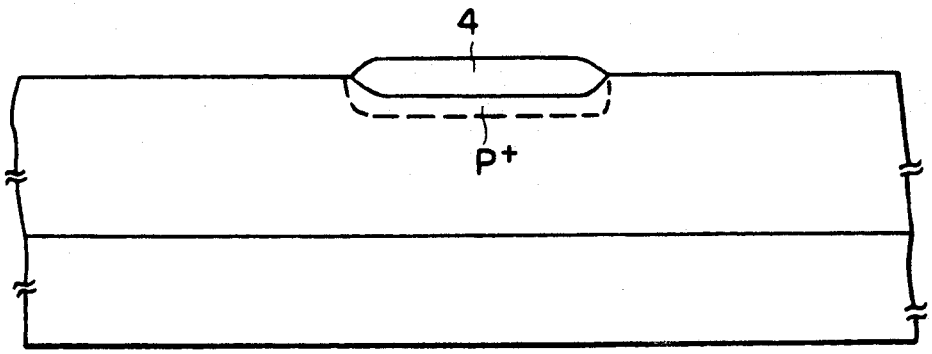

Impurities of p-type are injected into a region of the p-type well 2 which will be a field region in the well 2, and then a field oxide layer 4 is grown. From this resultant, a channel stop region of p+-type is formed (FIG. 5B).

Figure 5C:
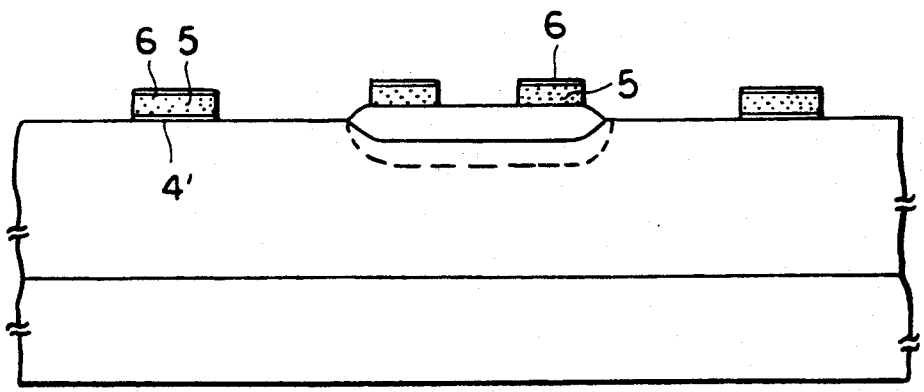

As shown in FIG. 5C, a gate oxide layer 4' is grown on regions to be active regions by way of a conventional way, and impurities are injected in order to control a threshold voltage of a transistor. A poly layer 5 is then deposited over the substrate, and a gate poly oxide layer 6 is grown on the poly layer. The layers 4', 5 and 6 are selectively etched out employing a conventional photolithographic technique, and the layer 5 results in a gate poly layer.

Figure 5D:
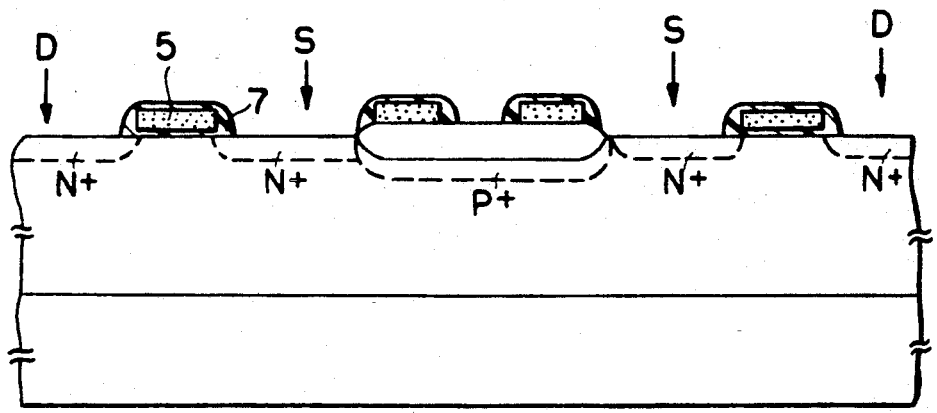

FIG. 5D shows an oxide spacer 7 which is formed in the sidewalls of the poly-silicon layer 5. Ion impurities of n-type are then injected into the p-well so as to form the regions which come to be a source S and a drain D of a transistor.

Figure 5E:
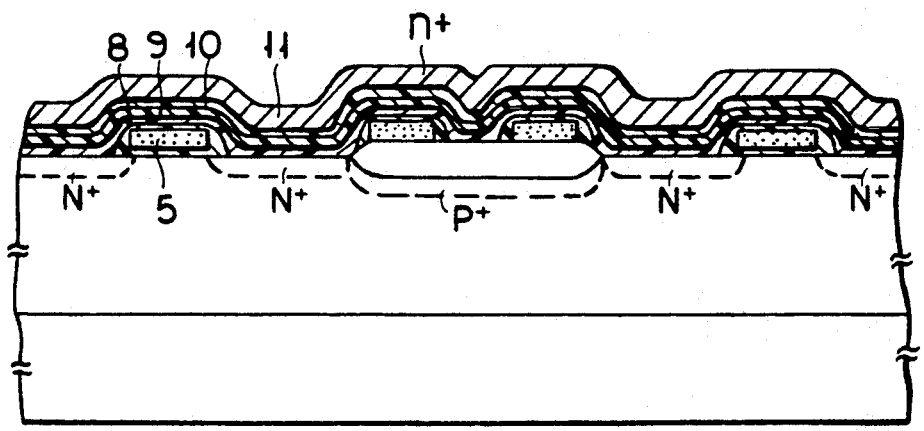

Thereafter, as shown in FIG. 5E, an oxide layer 8 (the lower oxide layer) are formed in sequence. The layers 8,9,10 are formed by the method of Chemical Vapor Deposition, and the thickness of each layer is about 1000 Å. A first poly-silicon layer 11 is then coated with the thickness of about 3000 521.

The layers 8,9 and 10 lay the role of the inter-poly insulating layer between the gate poly layer 5 and the first poly layer 11. The first poly layer may be formed with the poly doped initially with the n+-type impurities, or n+-type impurities may be doped after depositing the non-doped poly-silicon.

Figure 5F:
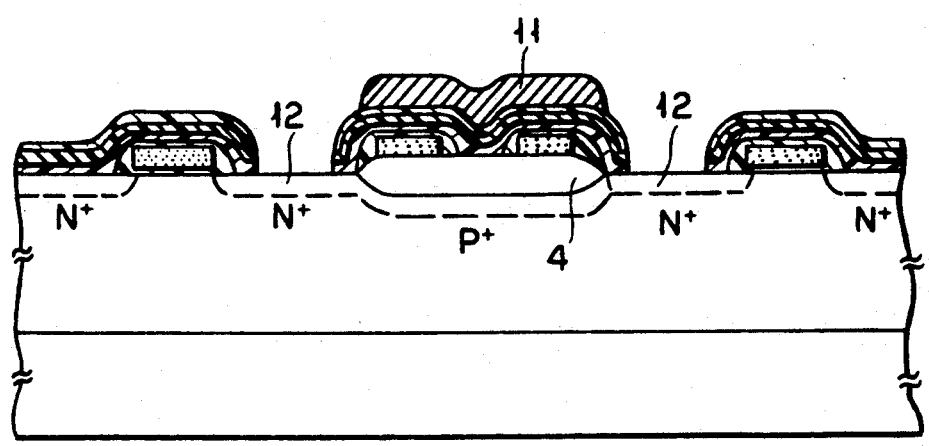

Referring now to FIG. 5F, the first poly layer 11 is selectively etched out, employing a saddle mask, except the poly-silicon coated over the upper surface side of the field oxide layer 4. During this process, the saddle mask causes the etched surface of the storage poly layer to be very rough so that this conditions make the effective area for the capacitor increase in a large scale. That is, the increment of the surface area with the curved surface states increases the quantity of the storage poly with respect to the another deposition of a poly-silicon layer.

Buried contacts 12 are then formed and the buried contact leads the source to be connected with a second poly which will be an electrode of a capacitor. The order of forming the first poly layer and the contact can be carried out reversely.

Figure 5G:
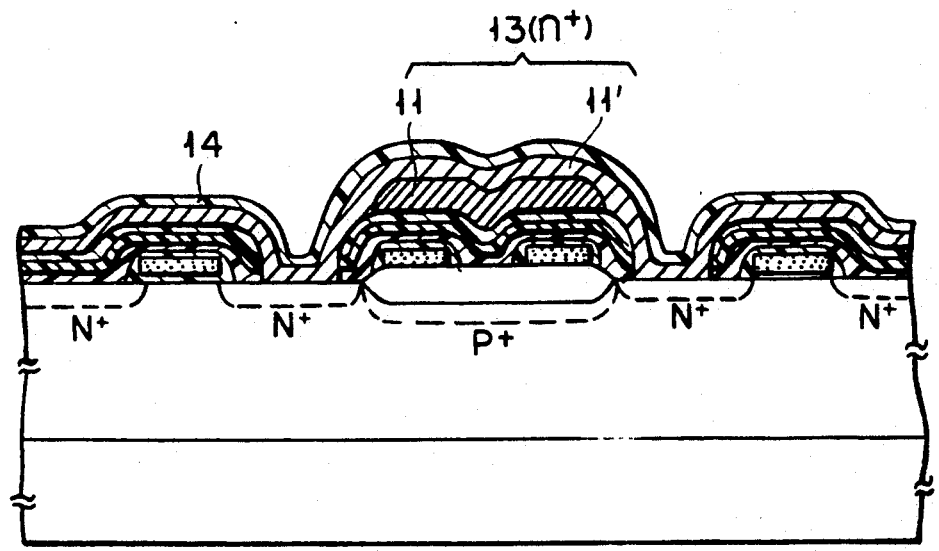

After that, as shown in FIG. 5G, the second poly layer 11' is deposited with about 2500 Å thickness over the entire surface of the p-well, and an oxide layer 14 is coated by the thickness of about 1500–3000 Å, by way of CVD technique, on the second poly layer.

Figure 5H:
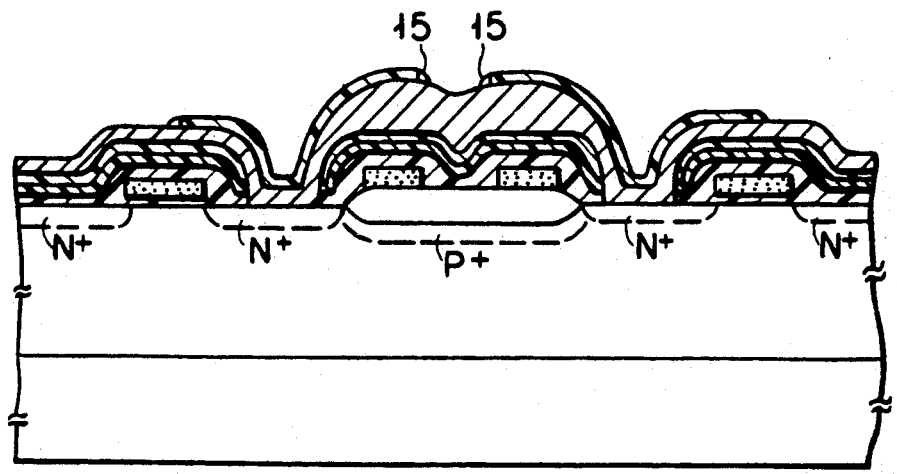

FIG. 5H shows the next step. The reference numeral 13 is a poly storage layer consisting of the first and second poly layer 11 and 11', and hereinafter the first and second poly-silicon layer 11, 11' will be represented as the poly storage layer and a single hatching.

Employing a photoresist mask, the oxide layer 14 is selectively etched out per unit of a cell. In this etching process, the etching pattern of the oxide layer 14 is restricted by the resolution capability of the photoresist. Accordingly, the size of the etching pattern must be at least equal or larger than the resolution capability. According to the present invention an oxide spacer is employed in order to maximize the capacitance. After forming the etching pattern of the storage poly, an oxide layer is coated on the oxide layer 14. The oxide spacer 15 is then formed through the etch back technique. The size of the spacer is determined with the magnitude of the storage layer to be remained, that is, with the capacitance of a capacitor according to a device characteristic.

Figure 5I:
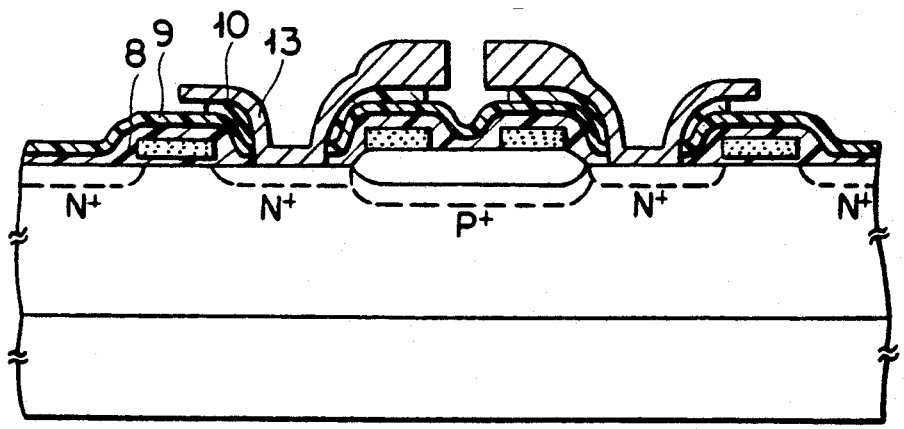

In FIG. 5I, the exposed storage poly layer 13 is removed by employing the remaining oxide layer 14 and oxide spacer 15 as a mask. This etching process exposes the portions of the oxide layer 10 below the removed storage layer. Subsequently, using the isotropic technique the oxide layer 10, 14 are removed. The isotropic etching make the oxide layer 10 have undercut surfaces because the boundary portions of the oxide layer 10 is etched out into apertures by the isotropic properties. Therefore, the exposed portions of the storage poly are increased, and the storage capability for charges is also increased.

The degrees of the undercut depend on the magnitude of capacitance to be obtained, and these are controlled by the difference of the thickness between the oxide layer 10 and 14. If the layer 14 is thicker than the layer 10, the degrees of the etching in the layer 10 may increase. The removal of the layer 10, 14 may be carried out separately.

Figure 5J:
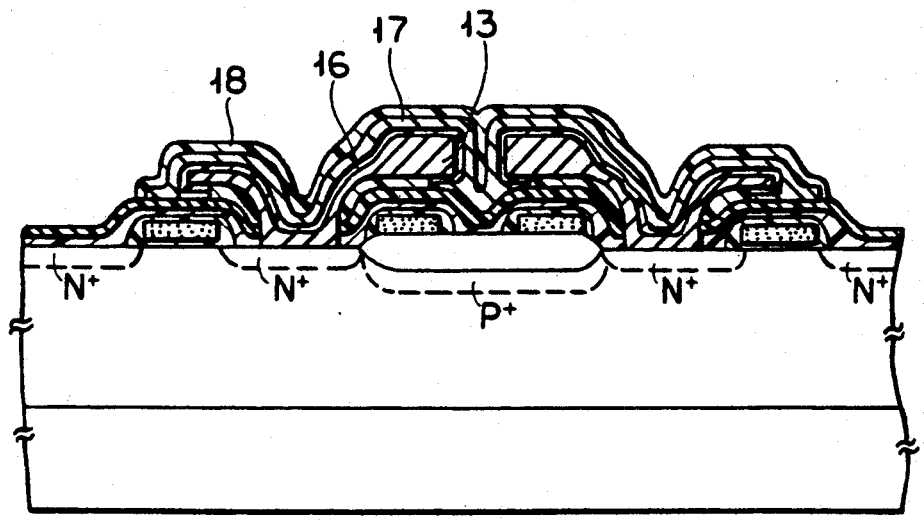

The protection by the nitride layer 9 for the oxide layer 8 prevents the short between the gate poly layer 5 and a plate poly layer 17 represented in FIG. 5J from occurring.

Referring now to FIG. 5J, a dielectric layer 16 for a capacitor is formed along the entire exposed surface of the storage poly layer 13. The plate poly layer 17 is then deposited over the p-well by about 1500 Å, and then the plate poly layer 17 is selectively removed as shown in FIG. 5J.

Then a plate poly oxide layer 18 is grown by oxidizing the plate layer 17 so as to have the thickness of about 1000 Å.

Figure 5K:
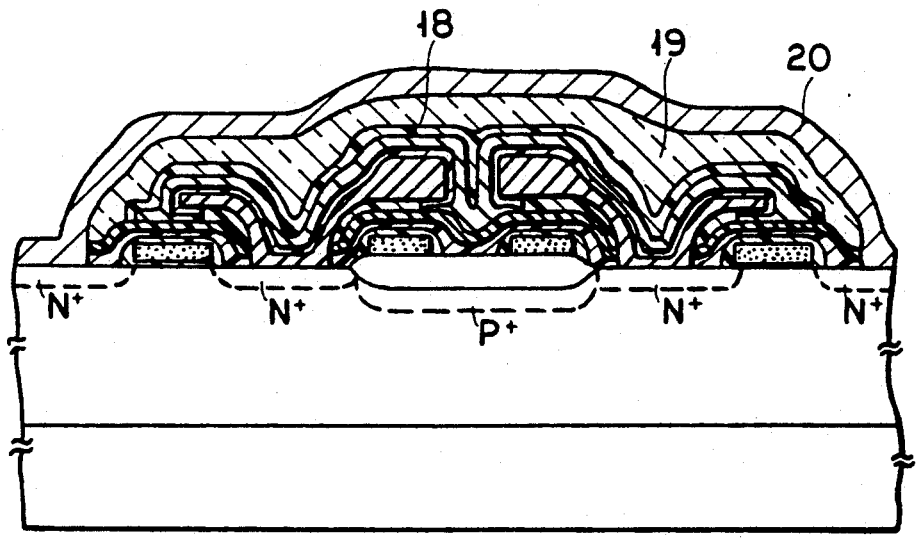

As shown in FIG. 5K, the BPSG (Boron Phosphorus Silicate Glass) 19 is deposited on the plate poly oxide layer 18 by the low temperature oxidation technique. A BPSG flow is then carried out for the planarization of the surface. Employing a mask, a bit line contact is formed and a policide layer 20 is filled therein.

Figure 5L:
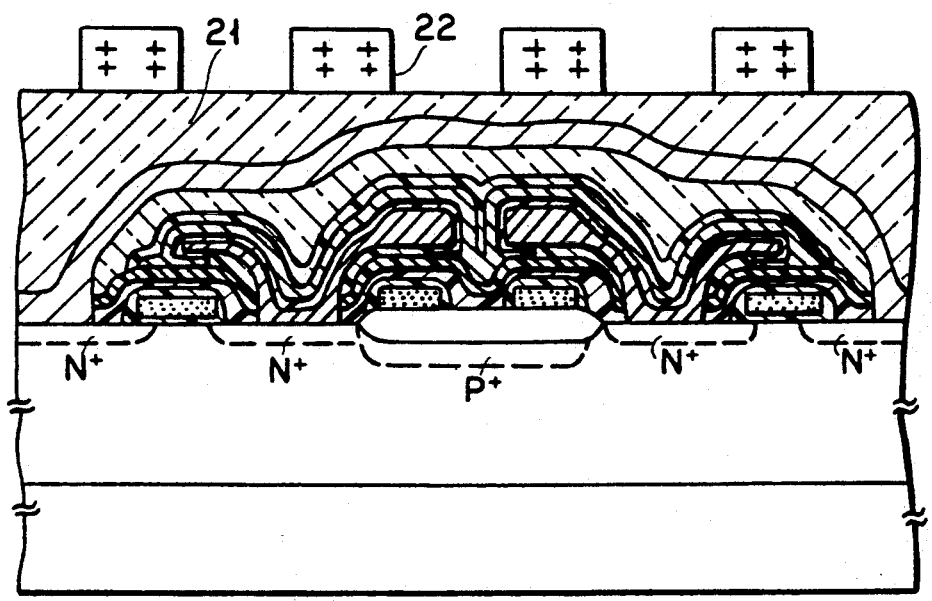

After the above processes, in FIG. 5L, the BPSG 21 is coated and the glass 21 is flowed. A contact for metal line is then formed using a mask and a metal layer is deposited. The coated metal layer is selectively removed employing a mask.

Figure 3:
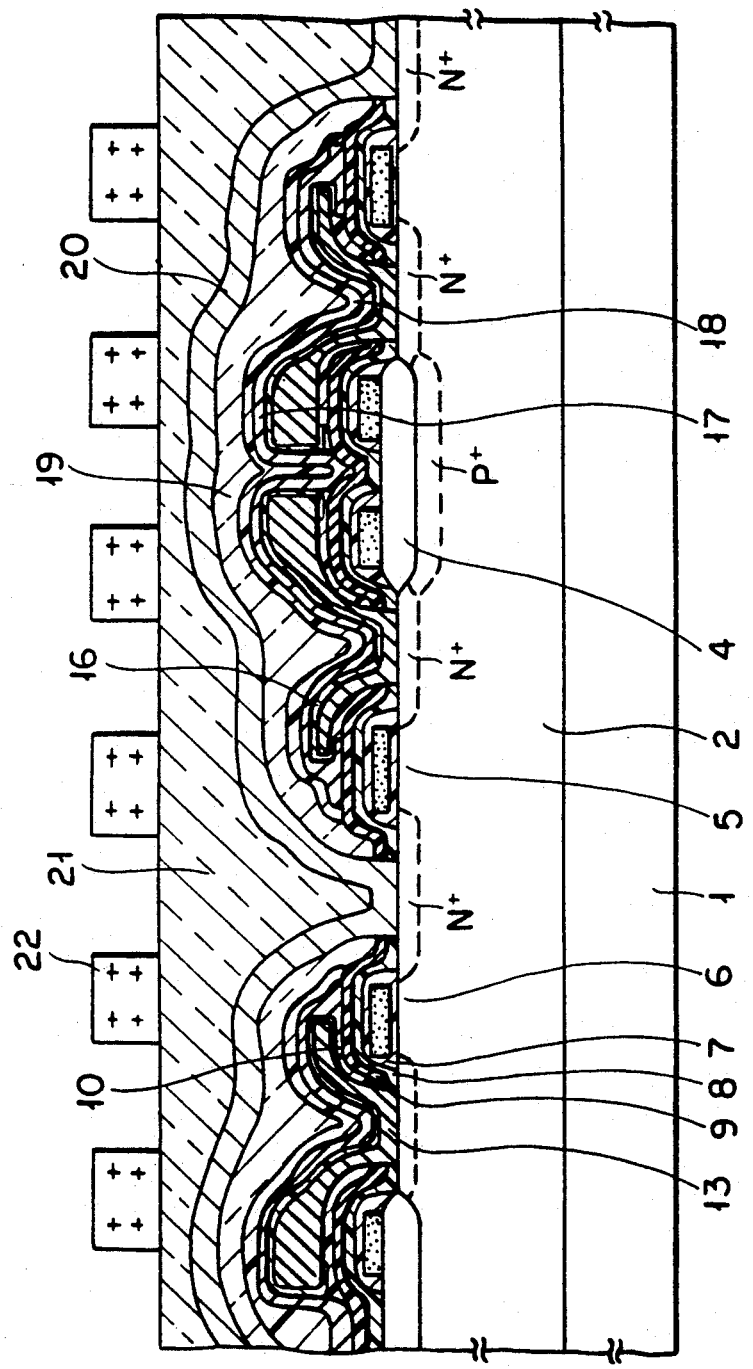
FIG. 3 is a vertical cross-sectional view of FIG. 2 taken along line 3—3 thereof.
Figure 4:
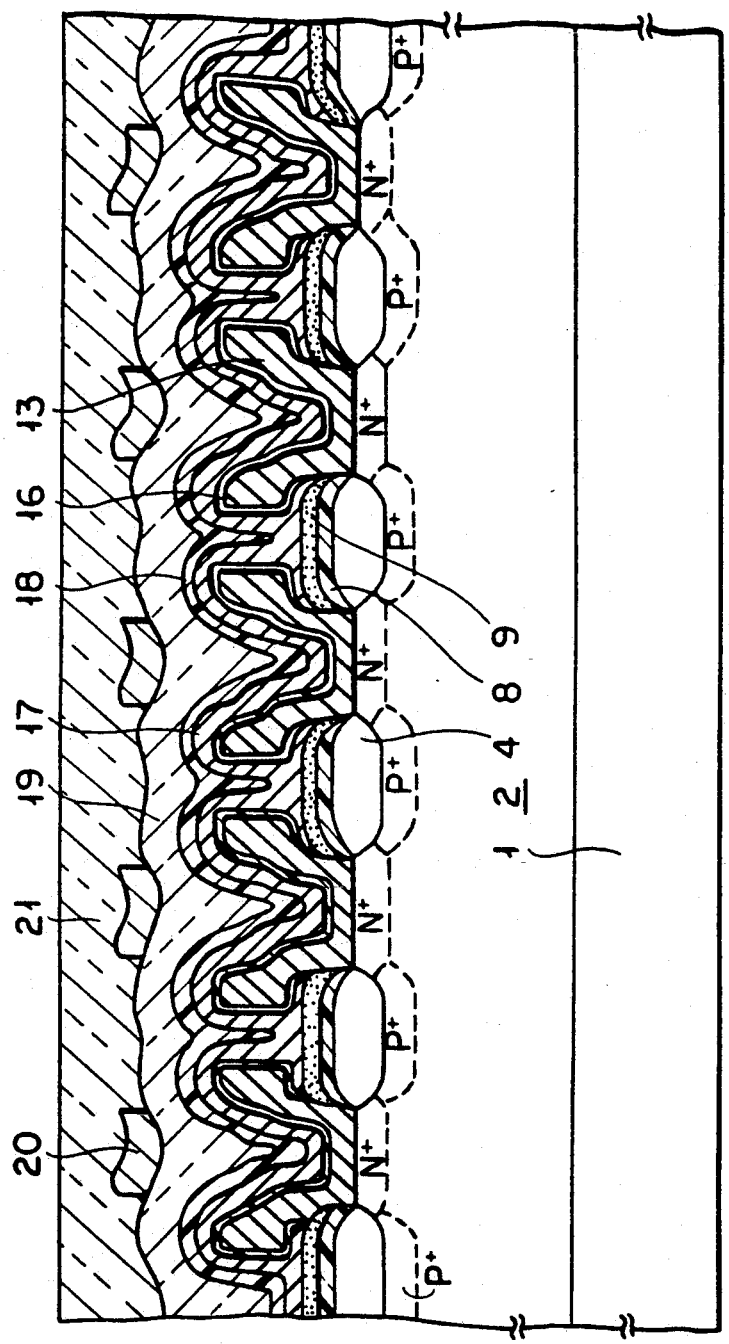
FIG. 4 is a vertical cross-sectional view of FIG. 2 taken along line 4-4 thereof.

The DRAM cell fabricated through the above-mentioned processes has a wide effective area for the capacitor as shown be in FIG. 2 and FIG. 3, because the storage poly-silicon for capacitor is formed with an enough thickness over the field oxide layer 4, as well as the exposed area of the storage poly layer 13 is increased by causing the undercut just below the boundary region of the storage layer to bring about; so that the effective area of the capacitor results in wide area. Furthermore, with the employment of the oxide spacer, the magnitude of capacitance is increased and controlled with the dimensions of the oxide spacer.

The effects of the DRAM cell manufactured according to the present invention are as follows.

Since the storage poly layer to be the capacitor electrode is formed not only thick in the region over the field oxide layer but also shallowly in the contact region of the bit line, the effective area of the capacitor increases and the topology of the bit line contact area is improved.

When the storage poly is removed, the gap between the remaining storage poly layer is narrow as much as possible by using the oxide spacer, so that the remaining area of the storage poly layer is wide and the effective area of the capacitor is increased once more.

The third factor which increases the capacitor area is the undercut phenomenon which breaks down in the region just below the boundary region of the storage poly layer.

Accordingly, since the effective area for the capacitor is enormously increased through the above-mentioned three factors according to the invention, the area of the DRAM decreases, and this result makes the manufacturing of the VLSI possible.

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A method for manufacturing a stack capacitor DRAM comprising the steps of;
   a) forming a composite insulating layer over a well doped to one conductivity type in a semiconductor substrate comprising a gate polysilicon layer, a field oxide layer, and a channel stop region;
   b) depositing a first polysilicon layer;
   c) removing selectively said first polysilicon layer to expose a portion of said composite insulating layer;
   d) removing selectively said exposed portion to expose a buried contact region;
   e) depositing a second polysilicon layer, wherein the remaining portions of said first polysilicon layer and said second polysilicon layer become a composite storage polysilicon single layer and said storage layer overlies said contact region;
   f) forming an oxide layer over the entire surface of the well;
   g) selectively removing said oxide layer;
   h) etching selectively said storage polysilicon layer employing said oxide layer as a mask to provide said storage layer with a side edge;
   i) etching said oxide layer including a portion of said composite insulating layer extending beneath said storage layer from said side edge;
   j) forming a capacitor dielectric layer on said storage polysilicon layer;
   k) depositing a plate polysilicon layer;
   l) etching selectively said plate polysilicon layer;
   m) forming a plate polysilicon oxide layer by oxidizing the surface of said plate polysilicon layer; and
   n) forming a bit line.

2. A method for manufacturing a stack capacitor DRAM as claimed in claim 1, wherein said storage polysilicon layer has a potion of increased thickness in a region over said field oxide layer in comparison with the thickness of said storage layer where it overlies said contact region.

3. A method for manufacturing a stack capacitor DRAM as claimed in claim 1, wherein the selective removal of said first polysilicon layer is carried out employing a saddle mask, thereby a surface condition of said storage polysilicon layer in the portion of increased thickness is rough.

4. A method for manufacturing a stack capacitor DRAM as claimed in claim 1, wherein said first polysilicon layer is deposited by polysilicon material pre-doped to one conductivity type or is doped to one conductivity type after depositing said polysilicon material.

5. A method for manufacturing a stack capacitor DRAM comprising the steps of:
   a) forming a composite insulating layer over a well doped to one conductivity type in a semiconductor substrate comprising a gate polysilicon layer, a field oxide layer, and a channel stop region;
   b) depositing a first polysilicon layer;
   c) removing selectively said first polysilicon layer to expose a portion of said composite insulating layer;
   d) removing selectively said exposed portion to expose a buried contact region;
   e) depositing a second polysilicon layer, wherein the remaining portions of said first polysilicon layer and said second polysilicon layer become a composite storage polysilicon single layer;
   f) forming an oxide layer over the entire surface of the well;
   g) selectively removing said oxide layer;
   h) forming an oxide spacer by etchback after forming an oxide layer on said storage polysilicon layer;
   i) etching selectively said storage polysilicon layer employing said oxide layer and oxide spacer as a mask to provide said storage layer with a side edge;
   j) etching said oxide layer and oxide spacer including a portion of said composite insulating layer extending beneath said storage layer from said side edge;
   k) forming a capacitor dielectric layer on said storage polysilicon layer;
   l) depositing a plate polysilicon layer;
   m) etching selectively said plate polysilicon layer;
   n) forming a plate polysilicon oxide layer by oxidizing the surface of said plate polysilicon layer; and
   o) forming a bit line.

6. A method for manufacturing a stack capacitor DRAM comprising eh steps of:
   a) forming a composite insulating layer including a lower oxide layer, an intermediate nitride layer and an upper oxide layer over a well doped to one conductivity type in a semiconductor substrate comprising a gate polysilicon layer, a field oxide layer, and a channel stop region;
   b) depositing a first polysilicon layer;
   c) removing selectively said first polysilicon layer to expose a surface portion of said composite insulating layer;
   d) removing selectively said exposed portion to expose a buried contact region;
   e) depositing a second polysilicon layer, wherein the remaining portions of said first polysilicon layer and said second polysilicon layer become a composite storage polysilicon single layer;
   f) forming an oxide layer over the entire surface of the well;
   g) selectively removing said oxide layer;
   h) forming an oxide spacer by etchback after forming an oxide layer on said storage polysilicon layer;
   i) etching selectively said storage polysilicon layer employing said oxide layer and oxide spacer as a mask to provide said storage layer with a side edge;
   j) etching said oxide layer, said oxide spacer, and exposed portions of said upper oxide layer of said composite insulating layer by isotropic etching, the etching of said upper oxide layer undercutting said storage layer inwardly from said side edge;

k) forming a capacitor dielectric layer on said storage polysilicon layer;

l) depositing a plate polysilicon layer;

m) etching selectively said plate polysilicon layer;

n) forming a plate polysilicon oxide layer by oxidizing the surface of said plate polysilicon layer; and o) forming a bit line.

7. A method for manufacturing a stack capacitor DRAM as claimed in claim 6, comprising forming said oxide layer to a thickness greater than that of said upper oxide layer of said composite insulating layer.

8. A method of manufacturing a stack capacitor DRAM comprising the steps of:

a) forming a composite insulating layer including a lower oxide layer, an intermediate nitride layer and an upper oxide layer over a well doped one conductivity type in a semiconductor substrate comprising a gate polysilicon layer, a field oxide layer, and a channel stop region;

b) depositing a first polysilicon layer;

c) removing said first polysilicon layer except a portion in a region over said field oxide layer thereby exposing a surface portion of said composite insulating layer;

d) removing selectively a portion of said composite layer to expose a buried contact region;

e) depositing a second polysilicon layer, wherein the remaining portions of said first polysilicon layer and said second polysilicon layer become a composite storage polysilicon single layer;

f) forming an oxide layer over the entire surface of the well;

g) selectively removing said oxide layer;

h) forming an oxide spacer by etchback after forming an oxide layer on said storage polysilicon layer;

i) etching selectively said storage polysilicon layer employing said oxide layer and oxide spacer as a mask to provide said storage layer with a side edge;

j) etching said oxide layer, said oxide spacer, and exposed portions of said upper oxide layer of said composite insulating layer by isotropic etching, the etching of said upper oxide layer of said composite insulating layer undercutting said storage layer inwardly from said side edge;

k) forming a capacitor dielectric layer on said storage polysilicon layer;

l) depositing a plate polysilicon layer;

m) etching selectively said plate polysilicon layer;

n) forming a plate polysilicon oxide layer by oxidizing the surface of said plate polysilicon layer; and o) forming a bit line.

* * * * *